United States Patent
Michel et al.

(10) Patent No.: US 6,617,661 B2
(45) Date of Patent: *Sep. 9, 2003

(54) HIGH VOLTAGE COMPONENT AND METHOD FOR MAKING SAME

(75) Inventors: Hartmut Michel, Reutlingen (DE); Bernd Bireckoven, Kusterdingen (DE); Dirk Hoheisel, Reutlingen (DE); Ning Qu, Reutlingen (DE)

(73) Assignee: Robert Bosch GmbH, Stuttgart (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/485,915

(22) PCT Filed: Feb. 28, 1998

(86) PCT No.: PCT/DE98/00597

§ 371 (c)(1),
(2), (4) Date: May 17, 2000

(87) PCT Pub. No.: WO99/09597

PCT Pub. Date: Feb. 25, 1999

(65) Prior Publication Data

US 2002/0109193 A1 Aug. 15, 2002

(30) Foreign Application Priority Data

Aug. 16, 1997 (DE) .......................... 197 35 542

(51) Int. Cl.⁷ ............... H01L 29/00; H01L 29/74

(52) U.S. Cl. ............... 257/502; 257/122; 257/124; 257/162; 257/500

(58) Field of Search ................... 257/146, 147, 257/119, 378, 122, 154, 124, 126, 162, 500–502, 499, 152, 592

(56) References Cited

U.S. PATENT DOCUMENTS

| | | | | |
|---|---|---|---|---|
| 4,520,277 A | * | 5/1985 | Hahn | 307/252 |
| 5,241,210 A | | 8/1993 | Nakagawa et al. | |
| 5,773,868 A | * | 6/1998 | Endo | 257/514 |
| 5,982,016 A | * | 11/1999 | Pezzani et al. | 257/502 |
| 6,252,256 B1 | * | 6/2001 | Ugge et al. | 257/111 |

FOREIGN PATENT DOCUMENTS

| | | | | |
|---|---|---|---|---|
| DE | 25 21 848 | | 11/1976 | |
| DE | 41 08 611 | | 6/1992 | |
| EP | 0 035 841 | | 9/1981 | |
| JP | 54-127687 | * | 10/1979 | H01L/29/747 |
| JP | 7-235660 | * | 9/1995 | H01L/29/74 |

* cited by examiner

*Primary Examiner*—Ori Nadav
(74) *Attorney, Agent, or Firm*—Kenyon & Kenyon

(57) ABSTRACT

A high-voltage component and a method for its manufacture. The component functions to switch currents at high voltages. The component is composed of partial components that are connected in series and are laterally supported on a self-supporting semiconductor wafer. The partial components switch through, for example, at a given voltage applied between a first bridge cathode and an anodic metallization.

6 Claims, 4 Drawing Sheets

HIGH VOLTAGE COMPONENT AND METHOD FOR MAKING SAME

BACKGROUND INFORMATION

The present invention relates to a high-voltage component and a method for manufacturing a high-voltage component. From German Published Patent Application No. 4108611, a high-voltage component is already known in which laterally arranged partial components are connected in series on a supporting plate. In this context, the partial components are integrated in a thin silicon layer that is applied on the supporting plate, the silicon layer preferably having a thickness of roughly 100 micrometers.

SUMMARY OF THE INVENTION

In contrast, the high-voltage component according to the present invention has the advantage of a simple design, since this is due to the fact that a wafer is used which supports itself, no supporting plate is necessary. In this way, a compact, space-saving design results. It should be viewed as a further advantage that through the use of a correspondingly thick wafer, a better current distribution results, in particular a higher current carrying capacity of the high-voltage component, since a greater volume of semiconductor material can contribute to a current flow that is high for a short duration, as is necessary particularly in the case of ignition systems used in motor vehicles. The method according to the present invention has the advantage that it represents a simple method for manufacturing a high-voltage component, dispensing in particular with the use of a supporting plate as well as being able to be packed directly, e.g., by remodeling or by re-casting, without the cumbersome handling of an insulated supporting plate after the etching and passivizing.

It is particularly advantageous that the high-voltage component has planar p-doped wells next to p-doped areas that are configured as separating diffusion areas. In this way, it is possible to realize a base width of an NPN partial transistor that is variable in extensive areas but also spatially homogeneous, for example, if an NPN partial transistor of this type is part of a thyristor that represents the partial component. In particular, spatially defined, homogeneous, small base widths can be used that in a thyristor as component lead to large current amplifications, such as are necessary for the use in the control of an ignition current of an ignition coil in a motor vehicle. In addition, in spite of the use of a thick, self-supporting wafer, it is possible to achieve a high bottom through resistance, so that it becomes possible to trigger the thyristor in a dependable manner and at not excessively high anodic currents. The method of introducing the separating diffusions and also introducing the planar p-doped wells makes possible a simple determination of precise base widths in the use of a thick wafer. This can be explained by the fact that diffusion zones that only protruding into the wafer in a planar fashion can be determined more precisely in their geometric dimensions than, for example, separating diffusion areas.

If the p-well is connected to the p-area configured as a separating diffusion area, the result is a more compact design in the lateral dimensions, and the manufacturing method also becomes simpler.

Providing a resistor area that is in electrical connection with the p-well assures a controlled response to temperature changes of the electrical resistor, which is significant for triggering the high-voltage component.

DETAILED DESCRIPTION

Figure 1:
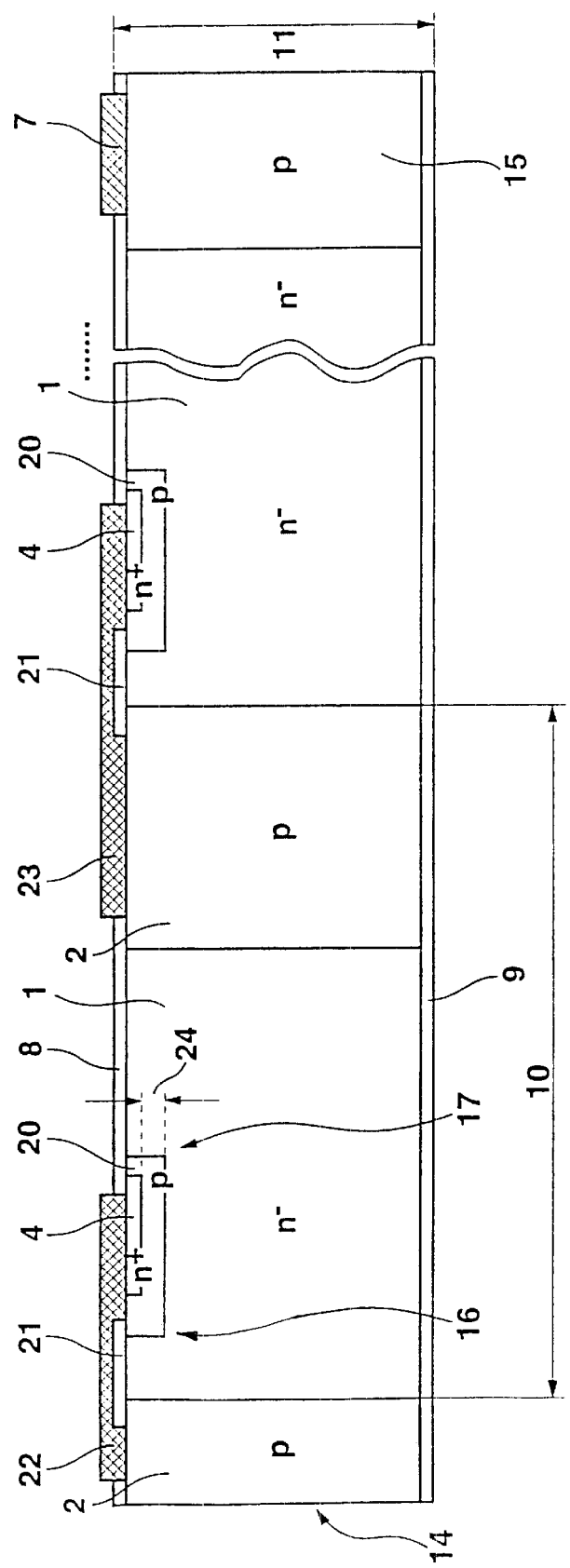
FIG. 1 shows a first embodiment according to the present invention.

FIG. 1 shows a high-voltage component according to the present invention, arranged in a semiconductor wafer 14. The high-voltage component has a multiplicity of partial components 10 that are connected in series. The exemplary embodiment depicted in partial component 10 is a thyristor. The wafer 14 is weakly n-doped and has, configured as separating diffusion areas, p-areas 2 that completely penetrate semiconductor wafer 14, as is depicted in the cross-section view in FIG. 1. In this way, semiconductor wafer 14 is divided into n-doped areas 1. P-areas 2, just as n-doped areas 1, run essentially parallel to each other, i.e., they form parallel strips that extend perpendicular to the cross-section view depicted in FIG. 1. In n-doped areas 1, in each case, a p-doped well 20 is introduced, which unlike p-areas 2, does not completely penetrate the semiconductor wafer. P-wells 20 extend from a left boundary 16 to a right boundary 17, the boundaries extending perpendicular to the cross-section view and essentially parallel to n-doped areas 1 as well as p-areas 2. In p-wells 20, in each case, a strongly n-doped strip 4 is embedded, which also runs perpendicular to the cross-section view and parallel to the other areas. Lined on the lower side by an insulation 21, first bridge cathode 22 and second bridge cathode 23, in each case, connect p-well 20 to p-area 2 of the adjoining partial component. Simultaneously, powerfully n-doped strip 4 introduced into the p-well is contacted by the respective bridge cathode. An edge-positioned p-area 15 can be contacted via an anodic metallization 7. The remaining surface of the front side of the high-voltage component, on which no contacts are disposed, is covered for insulating purposes with an oxide layer 8. The back side of semiconductor wafer 14 is also covered with a further oxide layer 9. Thickness 11 of the wafer from the front to the back side fluctuates within a range of, for example, 200 to 500 micrometers, preferably in a range of from 200 to 250 micrometers. Finally, the high-voltage component furnished with connecting wires at first bridge cathode 22 and at anodic metallization 7 is also surrounded by a protective material or plastic (connecting wires, just like the packing, are not depicted in FIG. 1).

If a voltage is applied in the forward direction between first bridge cathode 22 and anodic metallization 7, then at first only a blocking current flows as long as between powerfully n-doped strip 4 and p-well 20 a potential difference exists that is smaller than 0.6 volts. This potential difference is influenced by the so-called bottom through resistance of p-well 20. In this context, it is a question of the resistance of p-well 20 beneath powerfully n-doped strip 4, which the blocking current must flow through in order to arrive from right border 17 to left border 16. If the applied voltage rises, then the blocking voltage increases until, in the vicinity of right border 17, a potential difference between p-well 20 and powerfully n-doped strip 4 arises (for example, 0.6 volts), resulting in a breakdown of the high-voltage component ("overhead triggering" of the thyristor). The bottom through resistance in turn is influenced by layer thickness 24 of p-well 20 beneath powerfully n-doped strip 4. In this context, a small layer thickness 24 signifies a large bottom through resistance of p-well 20. If layer thickness 24 is thus sufficiently small, then a sufficiently large bottom through resistance can be generated, so that an overhead triggering occurs at blocking currents that are not excessively high. On the other hand, if no p-well 20 is provided, but rather, as is familiar from the related art, powerfully n-doped strip 4 is embedded in an area corresponding to p-area 2, the former area extending from the front side to the back side of the semiconductor wafer, then it can occur in a wafer thickness larger than 100 micrometers that the bottom through resistance is so small that the overhead triggering of the thyristor does not proceed correctly or only at a very high anodic current. In the conception that is known from the related art, the use of thick, self-supporting semiconductor wafers is therefore not possible. In the exemplary embodiment depicted, which eliminates this disadvantage, planar p-wells 20, calculated from the surface of the semiconductor wafer, have approximately a thickness of 20–40 micrometers. The current amplification of the individual NPN partial transistor, which is formed from powerfully n-doped strip 4, p-well 20 and n-doped area 1, and therefore also the sweep properties of the thyristor, in particular therefore also the switching speed of the high-voltage component, are strongly influenced by the distance between powerfully n-doped strip 4 and adjoining n-doped area 1. This distance is precisely layer thickness 24 of p-well 20 and represents the base width of the aforementioned NPN partial transistor. For a high switching speed of the high voltage component, in particular for a large triggering current directly after the overhead triggering of a thyristor, a large current amplification of the NPN partial transistor is provided, which can be obtained through a small layer thickness 24 and thus a small base width of the NPN partial transistor. In addition, the ratio of the doping material concentration of powerfully n-doped strip 4 to the doping material concentration of p-well 20 must be selected, in a suitable manner, so as to be high. Through the design indicated in FIG. 1, a homogeneous base width can also be generated, i.e., the base width is essentially the same at various locations of the NPN junction of the NPN partial transistor. That means that in response to triggering the thyristor at right border 17, the entire width of p-well 20 from left border 16 to right border 17 is immediately used for the purpose of current amplification, i.e., the NPN partial transistor functions along its entire spatial extent. The location-independent base width of the NPN partial transistor therefore results in the fact that, at a given current carrying capacity, partial component 10, configured as a thyristor, can be designed so as to be smaller in its lateral extension; in particular the width of powerfully n-doped strip 4 as well as the dimensions of p-well 20 from left border 16 to right border 17 can be reduced. In addition to configuring partial component 10 as a thyristor, the design according to the present invention can also be used for a series circuit of light sweep diodes (i.e., thyristors that are triggered by a light pulse) or for triac components.

Figure 2:
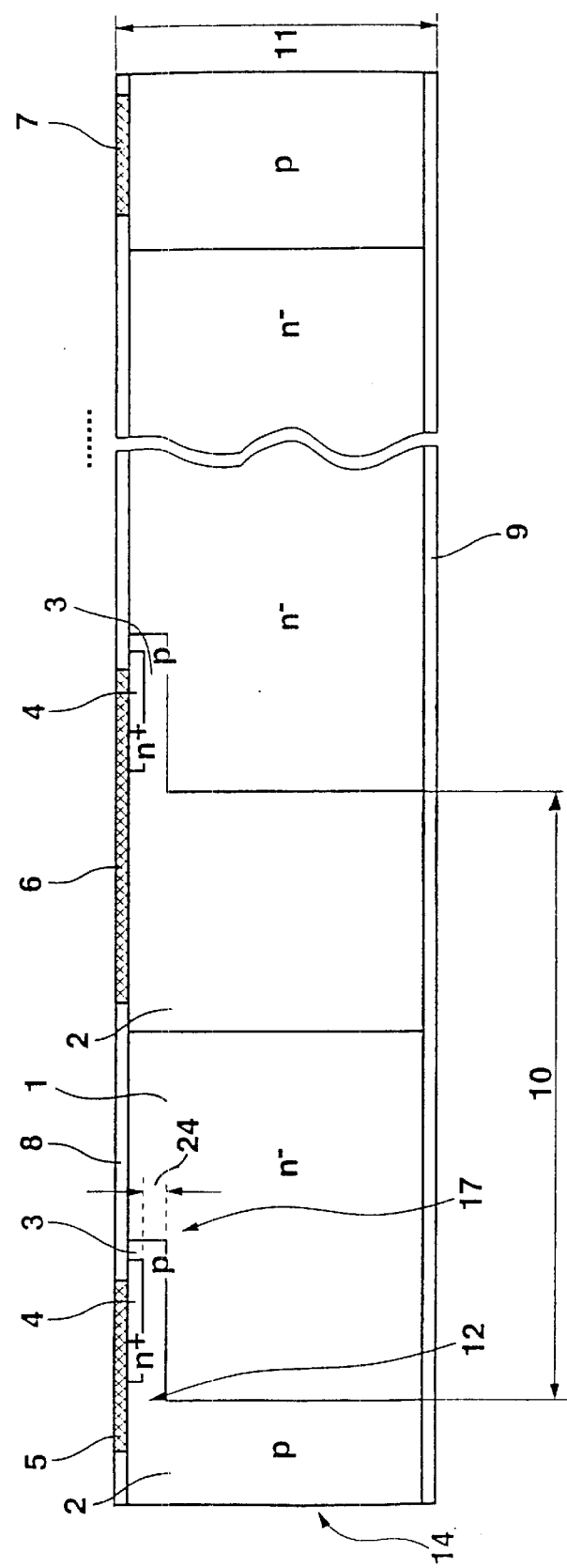
FIG. 2 shows a second embodiment according to the present invention.

FIG. 2 depicts a second exemplary embodiment of a high-voltage component, in which the same reference numerals as in FIG. 1 designate the same parts and are not described once again. The high-voltage component, alternatively to the execution according to FIG. 1, has a p-well 3, which is connected to p-area 2 of the adjoining partial component by a p-doped area 12. Instead of bridge cathodes as in FIG. 1, in the exemplary embodiment according to FIG. 2, a first cathode metallization 5, a second cathode metallization 6, and further metallizations that are not depicted in FIG. 2, are used as cathode metallizations, which are not lined on their lower side by an insulation 21. The latter is also here not necessary, since the cathode metallizations, due to p-doped area 12, cannot come in contact with n-doped area 1. The mode of functioning is essentially analogous to the previously described exemplary embodiment. However, it has a still more compact design, since provision is no longer made for a weakly n-doped area, which separates the p-wells from p-areas 2.

Figure 3:
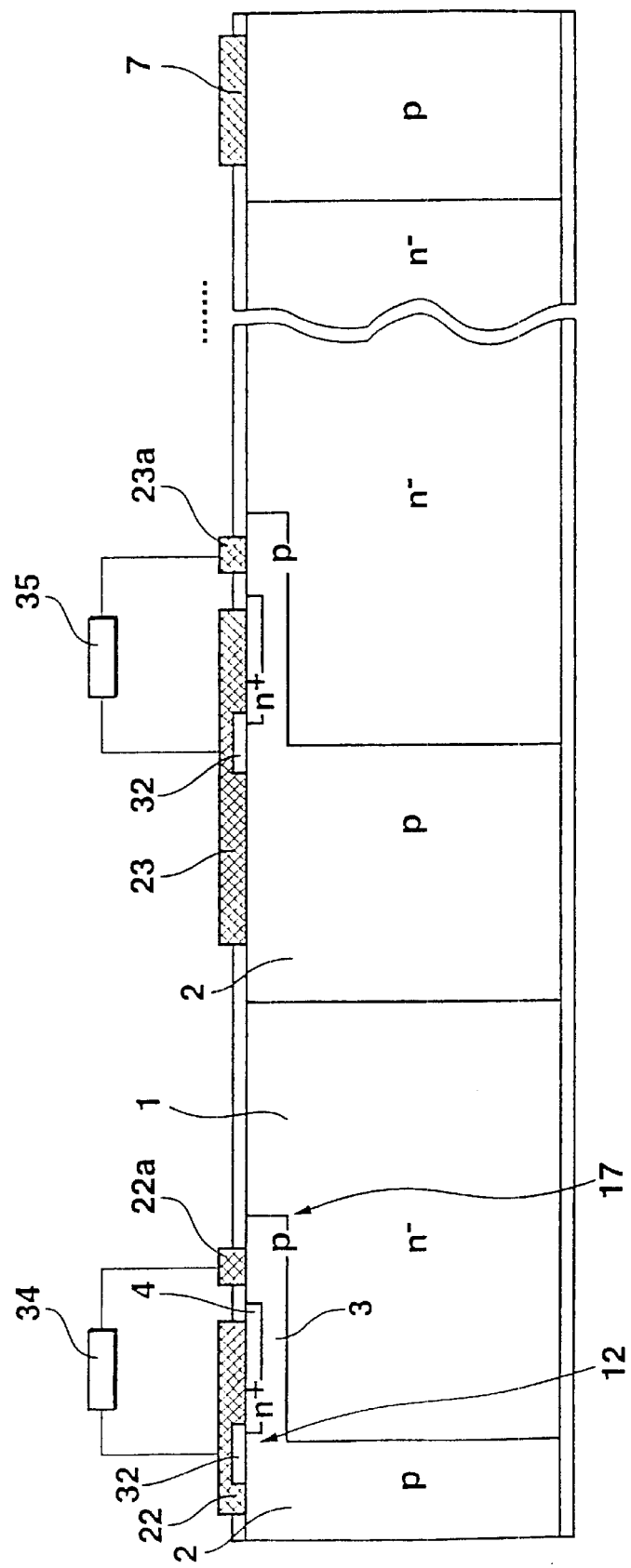
FIG. 3 shows a third embodiment according to the present invention.

FIG. 3 depicts a high-voltage component, that has partial components having a p-well 3, which is provided with a gate metallization 22a or 23a. These gate metallizations are electrically connected to adjoining bridge cathodes 22 and 23 by resistor areas 34 and 35, respectively. Gate metallization 22a or 23a in the depicted exemplary embodiment is configured strip-shaped so as to be perpendicular to the depicted cross-section view, and specifically parallel to the also strip-shaped bridge cathodes. The gate metallizations, in this context, contact the planar p-wells in the vicinity of their right border 17. The bridge cathodes are distinguished from the bridge cathodes of FIG. 1 in that the PN junction between powerfully n-doped strip 4 and p-well 3 in the area of p-doped area 12 is not short circuited by the bridge cathodes, i.e., in place of insulation 21, an alternative insulation 32 is provided, which is also arranged partially over powerfully n-doped strip 4. Insulation 32 functions to produce a distance between the bottom through resistances formed by the planar p-wells and the respective associated bridge cathodes 22, 23, etc. Resistor areas 34, 35, etc., can additionally be used to determine the sweep conditions of the high-voltage component. This is very advantageous if the sweep properties of the high-voltage component are to have a very small temperature dependence. Resistor areas 34, 35, etc., are in each case connected in parallel to the bottom through resistance of the respectively associated p-well. Since the temperature dependence of the resistor area, for example in the use of polysilicon, is small in comparison to the temperature dependence of the bottom through resistance, therefore when a small resistance value for the resistor areas is selected, the temperature dependence of the resistance of the parallel connection of the resistor area and the bottom through resistance, the connection influencing the sweep conditions, is determined by the temperature coefficient of the resistor area and is therefore small. In this way, the voltage applied that is necessary for the overhead triggering of one of the partial components between first bridge cathode 22 and anodic metallization 7 is essentially independent of the temperature of the high-voltage component. In a further, simpler specific embodiment, instead of bridge cathodes as depicted in FIG. 3, simple cathode metallizations are used, as explained in the description regarding FIG. 2, i.e., alternative insulations 32 are omitted. In order that, in this case, the temperature dependence of the sweep voltage be determined by the temperature dependence of the resistor area, the bottom through resistance should be selected so as to be larger than that in the exemplary embodiment depicted in FIG. 3.

Figure 4:
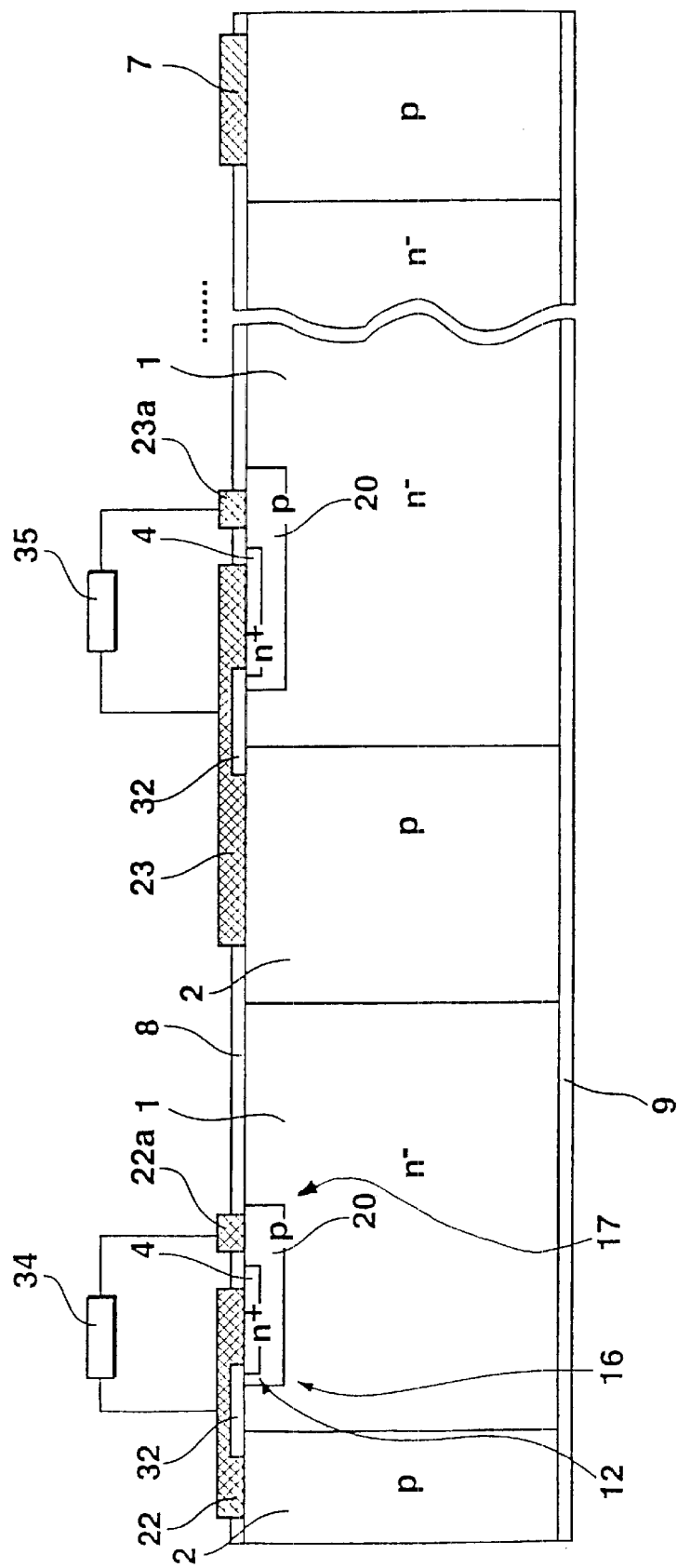
FIG. 4 shows a fourth embodiment according to the present invention.

FIG. 4 depicts a high-voltage component having separated p-wells 20, similar to the exemplary embodiment depicted in FIG. 1, however having resistor areas 34, 35, etc., as already explained in the description regarding FIG. 3. In contrast to the exemplary embodiment of FIG. 3, in the exemplary embodiment of FIG. 4, bottom through resistor and the associated resistor area are connected in series. Therefore, the value of the resistor area is selected so that it is larger than the bottom through resistance, so that the resistor area having its small temperature dependence determines the temperature dependence of the breakdown voltage. Alternatively, gate metallizations 22a and 23a, etc., can also be arranged above p-doped area 12 (in FIG. 4 this alternative arrangement of the gate metallization is not depicted; rather only area 12 is marked here with its reference numeral). In this case, the bridge cathodes, in their strip-shaped extension, perpendicular to the cross-section view, are provided with one or more holes, into which, insulated from the bridge cathode, the gate metallization is disposed, either as a simply coherent area or composed of a plurality of partial areas and separated by areas that are covered with the metallization of the bridge cathode. The resistor areas arising in the aforementioned exemplary embodiments are preferably manufactured out of poly silicon and are arranged either between the associated gate metallization and bridge cathode of the adjoining component or they are placed in an appropriate manner between the bridge cathode and the semiconductor wafer, in each case insulated from the respective associated bridge cathode and the semiconductor wafer. The latter arrangement is a preferred embodiment in order to assure the high-voltage endurance of the high-voltage component.

On the basis of the use of thick semiconductor wafers, in the method according to the present invention for manufacturing p-areas 2, a separating diffusion method is preferably used, by way of example. This separating diffusion method is made up of applying a layer of p-doping atoms on both sides of the semiconductor wafer in areas that are provided for p-areas 2, and in a further step causing these doping atoms to diffuse until the semiconductor wafer is composed of alternating p-doped and weakly n-doped areas similar to a zebra pattern. In further steps, p-wells as well as powerfully n-doped strips are introduced, it being the case, in particular, that if p-wells 3 are to be connected to p-areas 2 by p-doped areas 12, p-well 20 can be produced in a simple manner after the already introduced p-areas 2.

The back side of the wafer 14 is contact with an oxide layer 9 comprises alternating p-doped areas 2 weakly n-doped areas 1.

What is claimed is:

1. A high-voltage component disposed on an n-doped semiconductor wafer that is a self-supporting component part, comprising:
   a plurality of partial components connected in series, at least one of the plurality of partial components including a p-area extending from a front side of the wafer to a back side of the wafer;
   a planar p-doped well embedded in an n-doped area of the wafer; and
   a heavily n-doped strip embedded in the p-doped well;
   wherein a bridge connects the heavily n-doped strip to the p-area, and wherein the p-doped well is conjoined with the p-area by a p-doped area.

2. A high-voltage component disposed on an n-doped semiconductor wafer that is a self-supporting component part, comprising:
   a plurality of partial components connected in series, at least one of the plurality of partial components including a p-area extending from a front side of the wafer to a back side of the wafer;
   a planar p-doped well embedded in an n-doped area of the wafer;
   a heavily n-dopes strip embedded in the p-doped well, wherein a bridge connects the heavily n-doped strip to the p-area; and
   and element including one of a cathode metallization and a bridge cathode, the element contacting the p-doped well and the p-area together.

3. The component according to claim 2, further comprising:
   a resistor area, wherein:
      the p-doped well includes a gate metallization that is in an electrical contact with one of the cathode metallization and the bridge cathode via the resistor area.

4. The component according to claim 3, wherein:
   the resistor area is formed of a polysilicon.

5. A high-voltage component disposed on an n-doped semiconductor wafer that is a self-supporting component part, comprising:
   a plurality of partial components connected in series, at least one of the plurality of partial components including a p-area extending from a front side of the wafer to a back side of the wafer;
   a planar p-doped well embedded in an n-doped area of the wafer; and
   a heavily n-doped strip embedded in the p-doped well; wherein a bridge connects the heavily n-doped strip to the p-area, and wherein the back side of the wafer comprises alternating p-doped and weakly n-doped areas.

6. A high-voltage component disposed on an n-doped semiconductor wafer that is a self-supporting component part, comprising:
   a plurality of partial components connected in series, at least one of the plurality of partial components including a p-area extending from a front side of the wafer to a back side of the wafer;
   a planar p-doped well embedded in an n-doped area of the wafer; and
   a heavily n-doped strip embedded in the p-doped well; wherein a bridge connects the heavily n-doped strip to the p-area, and wherein the back side of the wafer in contact with an oxide layer comprises alternating p-doped and weakly n-doped areas.

* * * * *